(12) United States Patent
Kinoshita et al.

(10) Patent No.: US 9,310,438 B2
(45) Date of Patent: Apr. 12, 2016

(54) ELECTROMAGNETIC RELAY SWITCH DEPOSITION DETECTION DEVICE AND ELECTROMAGNETIC RELAY SWITCH DEPOSITION DETECTION METHOD

(71) Applicant: OMRON Corporation, Kyoto (JP)

(72) Inventors: Masahiro Kinoshita, Yamaga (JP); Hiroyuki Iwasaka, Yamaga (JP); Wataru Nakamura, Kyoto (JP)

(73) Assignee: OMRON CORPORATION, Kyoto-Shi (JP)

( * ) Notice: Subject to any disclaimer, the term of this patent is extended or adjusted under 35 U.S.C. 154(b) by 0 days.

(21) Appl. No.: 14/418,839

(22) PCT Filed: Jul. 8, 2013

(86) PCT No.: PCT/JP2013/068611
§ 371 (c)(1),
(2) Date: Jan. 30, 2015

(87) PCT Pub. No.: WO2014/034278
PCT Pub. Date: Mar. 6, 2014

(65) Prior Publication Data
US 2015/0204946 A1    Jul. 23, 2015

(30) Foreign Application Priority Data

Aug. 31, 2012    (JP) .................. 2012-192037

(51) Int. Cl.
*G01R 31/327* (2006.01)
*H01H 50/54* (2006.01)
*H01H 47/00* (2006.01)

(52) U.S. Cl.
CPC ........... *G01R 31/3278* (2013.01); *H01H 47/00* (2013.01); *H01H 47/002* (2013.01); *H01H 50/54* (2013.01); *H01H 2047/003* (2013.01)

(58) Field of Classification Search
CPC ..... H01H 1/0015; H01H 50/00; H01H 50/18; H01H 50/54
USPC .................................. 324/415–424
See application file for complete search history.

(56) References Cited

U.S. PATENT DOCUMENTS

| | | | | |
|---|---|---|---|---|
| 5,539,608 A | * | 7/1996 | Hurley | ............... G01R 31/3278 361/152 |
| 6,353,376 B1 | * | 3/2002 | Takeuchi | ............. H01H 33/285 218/141 |

(Continued)

FOREIGN PATENT DOCUMENTS

| JP | 2008-219973 A | 9/2008 |
|---|---|---|
| JP | 2009-032413 A | 2/2009 |

OTHER PUBLICATIONS

International Search Report for Application No. PCT/JP2013/068611 mailed Aug. 27, 2013 (3 pages).

*Primary Examiner* — Huy Q Phan
*Assistant Examiner* — Dustin Dickinson
(74) *Attorney, Agent, or Firm* — Nutter McClennen & Fish LLP; John J. Penny, Jr.

(57) ABSTRACT

A deposition detection circuit (3) provided in a deposition detection device (1) includes a determination circuit (4) determines whether the movable contact (9) is deposited based on a step input signal and a transient response signal when a drive signal is in an off state. The transient response signal is generated so as to correspond to voltage less than or equal to operating voltage of the electromagnetic relay switch (5) according to an excitation coil (6) and a fixed resistor (R1).

8 Claims, 13 Drawing Sheets

(56) References Cited

U.S. PATENT DOCUMENTS

| | | | |
|---|---|---|---|
| 8,208,243 B2 * | 6/2012 | Brandt | H01H 9/04 361/605 |
| 2005/0218899 A1 * | 10/2005 | Wong | G01R 31/3278 324/418 |
| 2008/0074215 A1 * | 3/2008 | Zhou | H01H 1/0015 335/132 |
| 2009/0322454 A1 * | 12/2009 | Tanaka | H01H 1/54 335/189 |
| 2010/0194354 A1 | 8/2010 | Gotou et al. | |
| 2010/0259347 A1 * | 10/2010 | Ziegler | H01H 83/04 335/14 |
| 2013/0187656 A1 * | 7/2013 | Barrenscheen | H03K 17/28 324/415 |
| 2014/0002093 A1 * | 1/2014 | Elliott | G01R 31/3278 324/423 |

* cited by examiner

Measurement on conditions of coil RL of 35 Ω, fixed resistor R1 of 105 Ω, and power supply voltage of 12 V Measurement of voltage VR after 3.34 msec since step input signal is input to SIG-2
Criterion is 4.5 V

| Normally off state | 6.0V |
|---|---|
| Deposited | 3.5V |

Measurement of time until VR reaches 4.5V since step input signal is input to SIG-2
Criterion is 3.34 msec

| Normally off state | 2.1msec |
|---|---|
| Deposited | 4.7msec |

ELECTROMAGNETIC RELAY SWITCH DEPOSITION DETECTION DEVICE AND ELECTROMAGNETIC RELAY SWITCH DEPOSITION DETECTION METHOD

TECHNICAL FIELD

The present invention relates to a deposition detection device that detects whether a movable contact is deposited in an electromagnetic relay switch, in which a movable iron core is arranged at one end of a drive shaft provided in a reciprocable manner in a center axis direction of an excitation coil while the movable contact is arranged at the other end of the drive shaft and the movable iron core and the movable contact are integrally reciprocable.

BACKGROUND ART

Sometimes an arc generated on turning on a contact of the electromagnetic relay switch causes deposition of the contact to generate a trouble that the contact remains in an on state even if a power supply is turned off. There is well known a configuration in which, in order to detect the deposition of the contact of the electromagnetic relay switch, current is passed through the excitation coil to turn on and off the contact, and the deposition of the contact is detected by actually checking the on and off states of the contact.

However, there is a strong demand to detect existence or non-existence of the deposition while the contact is not turned on, namely, the contact of the electromagnetic relay switch is kept in the off state.

A conventional configuration in which the existence or non-existence of the deposition is detected while the contact of the electromagnetic relay switch is kept in the off state will be described below. FIG. 10 is a circuit diagram illustrating a conventional deposition detection device. The deposition detection device includes a battery 91 in which plural battery units 92 are connected in series, a contactor 93 that is connected in series to positive-side and negative-side outputs of the battery 91 to supply power to a load 40, a control circuit 94 that controls the on and off states of the contactor 93, and a deposition detection circuit 95 that detects the deposition of the contact 80 of the contactor 93.

The contactor 93 includes a positive-electrode-side contactor 93A that is connected onto a positive side of the battery 91 and a contactor 93B that is connected to an output on a negative electrode side. The load 40 is a motor 43 and a power generator 44, which are connected through a DC/AC inverter 42, and the load 40 has a large-capacity capacitor 41 on a primary side of the DC/AC inverter 42.

The positive-electrode-side contactor 93A is connected between the positive electrode side of the battery 91 and a positive-electrode output terminal 99, and the negative-electrode-side contactor 93B is connected between the negative electrode side of the battery 91 and a negative-electrode output terminal 99. Each of the positive-electrode-side contactor 93A and the negative-electrode-side contactor 93B includes an excitation coil 81 that controls the on and off states of the contact 80. The positive-electrode-side contactor 93A and the negative-electrode-side contactor 93B are relays each of which includes the excitation coil 81 so as to be able to be independently controlled. In the positive-electrode-side contactor 93A and the negative-electrode-side contactor 93B, the contact 80 can be turned on while the excitation coil 81 is energized, and the energization of the coil 81 is stopped to turn off the contact 80.

When an ignition switch is turned on, the negative-electrode-side contactor 93B is switched to the on state while the positive-electrode-side contactor 93A is kept in the off state. At this point, the power supply precharges the capacitor 41 using a precharge circuit 96 connected in parallel to the positive-electrode-side contactor 93A. After the capacitor 41 is precharged, the positive-electrode-side contactor 93A is switched from the off state to the on state, and the running battery 91 is connected to the load 40. Then a precharge contactor 98 of the precharge circuit 96 is switched to the off state.

The precharge circuit 96 is a series-connected circuit including a precharge resistor 97 and the precharge contactor 98, and the precharge circuit 96 is connected in parallel to the positive-electrode-side contactor 93A. The precharge contactor 98 is switched to the on state before the positive-electrode-side contactor 93A is switched to the on state, and the capacitor 41 is charged using the running battery 91. The precharge resistor 97 restricts the current with which the running battery 91 charges the capacitor 41. The precharge circuit 96 charges the capacitor 41 while restricting the charge current using the precharge resistor 97.

The ignition switch of a vehicle is turned off, the control circuit 94 switches the contactor 93 to the off state. The control circuit 94 intercepts the energization of the excitation coils 81 of the positive-electrode-side contactor 93A and negative-electrode-side contactor 93B, namely the control circuit 94 puts the excitation coil 81 into a non-energized state, and the excitation coil 81 is switched to the off state. When the excitation coil 81 is in the non-energized state, the contactor 93 is switched to the off state in the normally operating state. However, in the contactor 93 in which the contact 80 is deposited, the contact 80 is not switched to the off state but kept in the on state while the excitation coil 81 is not energized.

In the state in which the control circuit 94 puts the excitation coil 81 into the non-energized state, a deposition detection circuit 95 detects whether the contactor 93 is switched to the off state, namely, whether the contact 80 of the contactor 93 is deposited. The deposition detection circuit 95 detects the inductance of the excitation coil 81, and detects the deposition of the contactor 93 using a value of the inductance.

FIG. 11A is a sectional view illustrating the on state (deposition state) of the contactor 93 in which the existence or non-existence of the deposition is detected, and FIG. 11B is a sectional view illustrating the off state of the contactor 93.

As illustrated in FIGS. 11A and 11B, the contact 80 of the contactor 93 is reciprocated by the excitation coil 81. Accordingly, a position of the contact 80 identifies a position of a plunger 82. At this point, FIG. 11A illustrates the on state of the contact 80 of the contactor 93, and the on state of the contact 80 is identical to the state in which the contact 80 is deposited. FIG. 11B illustrates the off state of the contact 80 of the contactor 93. The position of the plunger 82 changes the inductance of the excitation coil 81. This is because the plunger 82 is inserted in the excitation coil 81 to change the position of the plunger 82. In the contactor 93 in which the excitation coil 81 attracts the plunger 82, the plunger 82 attracted by the excitation coil 81 decreases a magnetic resistance of the excitation coil 81 to increase the inductance. In the contactor 93 of FIG. 11A, the inductance of the excitation coil 81 is increased in the energized state of the excitation coil 81. This is because the plunger 82 is deeply inserted in the excitation coil 81. As illustrated in FIG. 11B, the inductance of the excitation coil 81 is decreased in the non-energized state of the excitation coil 81. This is because the plunger 82 is ejected from the excitation coil 81 by a spring 83.

Accordingly, the deposition detection circuit 95 detects the inductance of the excitation coil 81 to be able to detect the position of the plunger 82, namely, the position of the contact 80. The plunger 82 is located at the position where the contact 80 is turned on when the excitation coil 81 has the large inductance, and the plunger 82 is located at the position where the contact 80 is turned off when the excitation coil 81 has the small inductance.

Therefore, the deposition detection circuit 95 detects the inductance of the excitation coil 81 to be able to detect the position of the plunger 82, namely, the on position and the off position of the contact 80 from the value of the inductance. In the non-energized state of the excitation coil 81, a determination of the deposition in which the contact 80 is located at the on position is made when the excitation coil 81 has the large inductance. This is because the excitation coil 81 has the small inductance in the non-energized state of the excitation coil 81.

FIG. 12 illustrates a configuration of the deposition detection circuit 95 of the power supply in FIG. 10, and FIG. 13 illustrates an operating principle that the deposition detection circuit 95 in FIG. 12 detects the inductance. The deposition detection circuit 95 includes a capacitor 84 that is connected in series to the excitation coil 81 of the contactor 93, and an AC power supply 85 that supplies detection voltage of the inductance to the series circuit including the capacitor 84 and the excitation coil 81. While the AC power supply 85 supplies AC power to the series circuit including the capacitor 84 and the excitation coil 81, the deposition detection circuit 95 detects the voltage induced at both ends of the excitation coil 81 to detect the inductance.

The voltage induced in the excitation coil 81 is increased in proportion to the inductance. Accordingly, the induction voltage of the excitation coil 81 is detected by the differential amplifier 86, and the induction voltage is input to a discrimination circuit 87 to be able to detect the inductance. As described above, the inductance of the excitation coil 81 in which the contact 80 is turned on is larger than the inductance of the excitation coil 81 in which the contact 80 is turned off. The induction voltage of the excitation coil 81, which is detected by the differential amplifier 86, is higher in the on state of contact 80 than that in the off state of the contact 80. Therefore, the discrimination circuit 87 compares the induction voltage input from the differential amplifier 86 to a setting voltage, the determination that the contact 80 is in the on state is made when the induction voltage is higher than the setting voltage, and the determination that the contact 80 is in the off state is made when the induction voltage is lower than the setting voltage.

PRIOR ART DOCUMENTS

Patent Document

Patent Document 1: Japanese Unexamined Patent Publication No. 2008-219973

SUMMARY OF THE INVENTION

Problems to be Solved by the Invention

However, in the configuration of FIGS. 10 to 13, it is necessary to provide a switch 70 that separates the control circuit 94 from the excitation coil 81 in order to drive the deposition detection circuit 95. Therefore, there is generated a problem in that the circuit is enlarged to increase the number of components such as a switch.

An object of the present invention is to provide, with a simple configuration, a deposition detection device for an electromagnetic relay switch, which can detect the inductance of the excitation coil to determine whether the movable contact is deposited.

Means for Solving the Problem

In order to solve the problem, according to one aspect of the present invention, a deposition detection device for an electromagnetic relay switch in which a movable iron core is arranged at one end of a drive shaft provided in a reciprocable manner in a center axis direction of an excitation coil while a movable contact is arranged at the other end of the drive shaft, the movable iron core and the movable contact being integrally reciprocable, the deposition detection device for the electromagnetic relay switch includes: a driver circuit configured to apply voltage to the excitation coil based on on and off states of a drive signal; and a deposition detection circuit that is connected to the excitation coil in parallel to the driver circuit in order to detect deposition of the movable contact. At this point, a fixed resistor connected to the excitation coil is provided in the deposition detection circuit, and the deposition detection circuit includes a determination circuit configured to determine whether the movable contact is deposited based on a step input signal and a transient response signal when the drive signal is in the off state, the transient response signal being generated so as to correspond to voltage less than or equal to operating voltage of the electromagnetic relay switch according to the excitation coil and the fixed resistor.

According to another aspect of the present invention, a deposition detection device for first and second electromagnetic relay switches, a first movable iron core being arranged at one end of a first drive shaft provided in a reciprocable manner in a center axis direction of a first excitation coil while a first movable contact is arranged at the other end of the first drive shaft in the first electromagnetic relay switch, the first movable iron core and the first movable contact being integrally reciprocable, a second movable iron core being arranged at one end of a second drive shaft provided in a reciprocable manner in a center axis direction of a second excitation coil while a second movable contact is arranged at the other end of the second drive shaft in the second electromagnetic relay switch, the second movable iron core and the second movable contact being integrally reciprocable, the deposition detection device for the first and second electromagnetic relay switches includes: a driver circuit configured to apply voltage to the first excitation coil based on on and off states of a first drive signal and apply voltage to the second excitation coil based on on and off states of a second drive signal; and a deposition detection circuit that is connected to the first and second excitation coils in order to detect depositions of the first and second movable contacts. At this point, a first fixed resistor connected to the first excitation coil and a second fixed resistor connected to the second excitation coil are provided in the deposition detection circuit, and the deposition detection circuit includes: a first determination circuit configured to determine whether the first movable contact is deposited based on a step input signal and a first transient response signal when the first drive signal is in the off state, the first transient response signal being generated so as to correspond to voltage less than or equal to operating voltage of the first electromagnetic relay switch according to the first excitation coil and the first fixed resistor; and a second determination circuit configured to determine whether the second movable contact is deposited based on a step input signal and a second transient response signal when the second drive signal is in the off state, the second transient response signal being generated so as to correspond to voltage less than or equal to operating voltage of the second electromagnetic relay switch according to the second excitation coil and the second fixed resistor.

According to still another aspect of the present invention, a deposition detection method for an electromagnetic relay switch in which a movable iron core is arranged at one end of a drive shaft provided in a reciprocable manner in a center axis direction of an excitation coil while a movable contact is arranged at the other end of the drive shaft, the movable iron core and the movable contact being integrally reciprocable, the deposition detection method for the electromagnetic relay switch includes: applying voltage to the excitation coil based on on and off states of a drive signal using a driver circuit; and detecting deposition of the movable contact using a deposition detection circuit connected to the excitation coil in parallel to the driver circuit. At this point, a fixed resistor connected to the excitation coil is provided in the deposition detection circuit, and whether the movable contact is deposited is determined based on a step input signal and a transient response signal when the drive signal is in the off state, the transient response signal being generated so as to correspond to voltage less than or equal to operating voltage of the electromagnetic relay switch according to the excitation coil and the fixed resistor.

According to yet another aspect of the present invention, a deposition detection method for first and second electromagnetic relay switches, a first movable iron core being arranged at one end of a first drive shaft provided in a reciprocable manner in a center axis direction of a first excitation coil while a first movable contact is arranged at the other end of the first drive shaft in the first electromagnetic relay switch, the first movable iron core and the first movable contact being integrally reciprocable, a second movable iron core being arranged at one end of a second drive shaft provided in a reciprocable manner in a center axis direction of a second excitation coil while a second movable contact is arranged at the other end of the second drive shaft in the second electromagnetic relay switch, the second movable iron core and the second movable contact being integrally reciprocable, the deposition detection method for the first and second electromagnetic relay switches includes: applying voltage to the first excitation coil based on on and off states of a first drive signal and applying voltage to the second excitation coil based on on and off states of a second drive signal; and detecting depositions of the first and second movable contacts using a deposition detection circuit that is connected to the first and second excitation coils. At this point, a first fixed resistor connected to the first excitation coil and a second fixed resistor connected to the second excitation coil are provided in the deposition detection circuit, whether the first movable contact is deposited is determined based on a step input signal and a first transient response signal when the first drive signal is in the off state, the first transient response signal being generated so as to correspond to voltage less than or equal to operating voltage of the first electromagnetic relay switch according to the first excitation coil and the first fixed resistor, and whether the second movable contact is deposited is determined based on a step input signal and a second transient response signal when the second drive signal is in the off state, the second transient response signal being generated so as to correspond to voltage less than or equal to operating voltage of the second electromagnetic relay switch according to the second excitation coil and the second fixed resistor.

Effect of the Invention

When the drive signal is off, the deposition detection device for the electromagnetic relay switch according to the present invention determines whether the movable contact is deposited based on the step input signal and the transient response signal. The transient response signal is generated so as to correspond to the voltage less than or equal to the operating voltage of the electromagnetic relay switch according to the excitation coil and the fixed resistor. Therefore, in the case where the inductance of the excitation coil is detected to determine whether the movable contact is deposited, such a large-scale configuration as an oscillation circuit is eliminated unlike the conventional configuration, and whether the movable contact is deposited can be determined by detecting the inductance of the excitation coil using a simple configuration provided only with the fixed resistor.

MODE FOR CARRYING OUT THE INVENTION

A preferred embodiment of the present invention will be described below.

First Embodiment

Configuration of Deposition Detection Device 1

Figure 1:
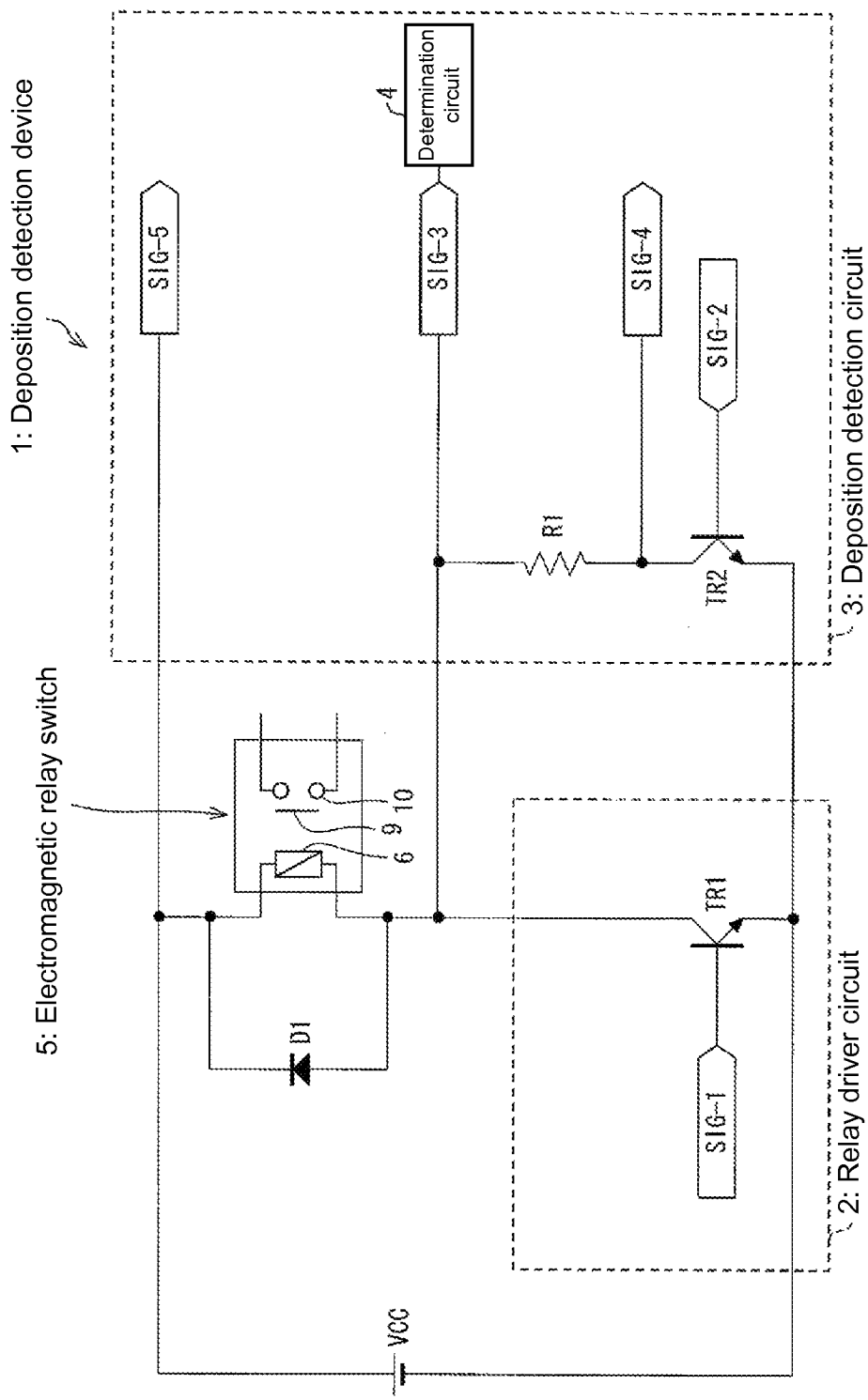
FIG. 1 is a circuit diagram illustrating a configuration of a deposition detection device according to a first embodiment.

FIG. 1 is a circuit diagram illustrating a configuration of a deposition detection device 1 according to a first embodiment. The deposition detection device 1 includes a relay driver circuit 2 that drives an electromagnetic relay switch 5 and a deposition detection circuit 3 that detects deposition of the electromagnetic relay switch 5.

Figure 2A:
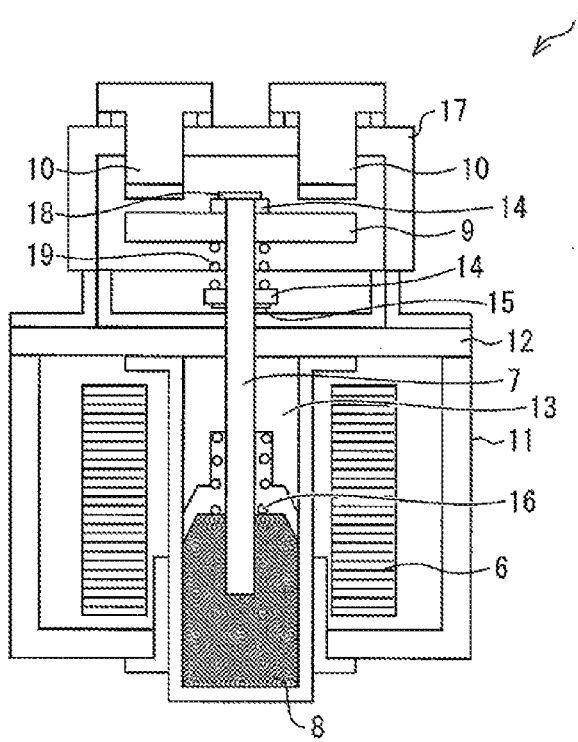
FIG. 2A is a sectional view illustrating a normally off state of an electromagnetic relay switch in which existence or non-existence of deposition is detected by the deposition detection device.
Figure 2B:
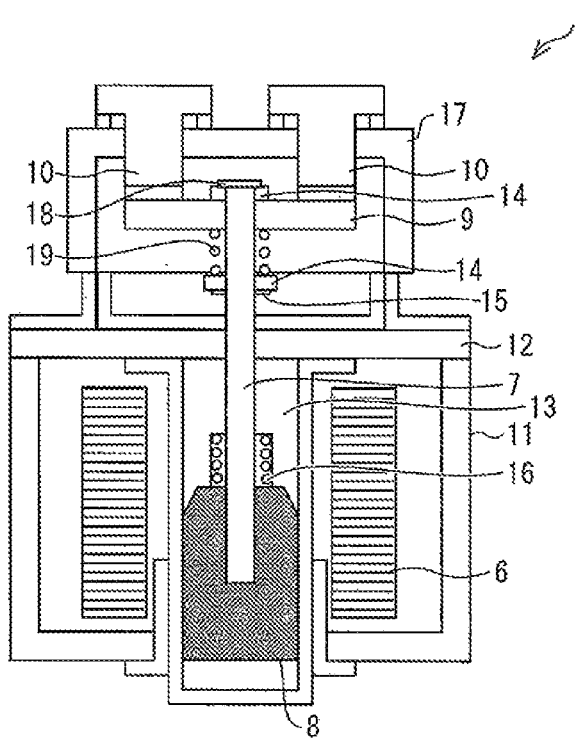
FIG. 2B is a sectional view illustrating a deposition state of the electromagnetic relay switch.

FIG. 2A is a sectional view illustrating a normally off state of the electromagnetic relay switch 5, and FIG. 2B is a sectional view illustrating a deposition state of the electromagnetic relay switch 5. The electromagnetic relay switch 5 includes an excitation coil 6 that is provided between a yoke 11 having a substantial U-shape in section and a yoke 12 bridging both ends of the yoke 11. A fixed iron core 13 is provided in the yoke 12 so as to project toward an inside of the excitation coil 6.

A drive shaft 7 is reciprocably provided along a center axis direction of the excitation coil 6 while piercing the fixed iron core 13 and the yoke 12. A movable iron core 8 is coupled to one end of the drive shaft 7. A returning coil spring 16 is provided between the movable iron core 8 and the fixed iron core 13.

A guard 18 is provided at the other end of the drive shaft 7, and a movable contact 9 is provided so as to be orthogonal to the drive shaft 7. Particularly, the movable contact 9 is placed between a pair of washers 14 attached to the drive shaft 7 together with a compression spring 19. The washer 14 placed on a lower side (based on FIG. 2) is fixed to the drive shaft 7 by an E-ring 15. A top surface of the movable contact 9 is abutted on a bottom surface of the washer 14 placed on an upper side (based on FIG. 2) by the compression spring 19, and a top surface of the upper-side washer 14 is abutted on a bottom surface of the guard 18 by the compression spring 19, thereby fixing the movable contact 9 to the drive shaft 7. A cover 17 and a pair of fixed contacts 10 are provided in the electromagnetic relay switch 5. The cover 17 is provided so as to cover the movable contact 9, and the pair of fixed contacts 10 are opposed to the movable contact 9. The movable iron core 8 and the movable contact 9 are configured to reciprocate integrally with the drive shaft 7.

With reference to FIG. 1, the relay driver circuit 2 includes a transistor TR1 coupled to the excitation coil 6. The transistor TR1 applies voltage to the excitation coil 6 based on a drive signal input to a terminal SIG-1.

The deposition detection circuit 3 includes a fixed resistor R1 connected to the excitation coil 6 and a transistor TR2 connected to a fixed resistor R1.

The transistors TR1 and TR2 are coupled to a negative-side terminal of a power supply VCC, and a positive-side terminal of the power supply VCC is coupled to a terminal on an opposite side to the relay driver circuit 2 of the excitation coil 6.

A terminal SIG-2 is coupled to the transistor TR2. A terminal SIG-3 is provided on the side of the excitation coil 6 of the fixed resistor R1. A terminal SIG-4 is provided between the fixed resistor R1 and the transistor TR2. A terminal SIG-5 is provided on the side of the power supply VCC of the excitation coil 6. A diode D1 is coupled to both ends of the excitation coil 6.

The deposition detection circuit 3 includes a determination circuit 4. When the drive signal input to the terminal SIG-1 is off, the determination circuit 4 determines whether the movable contact 9 is deposited based on a step input signal input to the terminal SIG-2 and a transient response signal. The transient response signal is generated so as to correspond to voltage less than or equal to operating voltage of the electromagnetic relay switch 5 according to the excitation coil 6 and the fixed resistor R1.

The transistor TR2 is not limited to a transistor, but any switch, such as an FET, a photo coupler, and a relay, which performs on and off operations in response to the input to the terminal SIG-2 from the outside.

Operation of Deposition Detection Device 1

Figure 3:
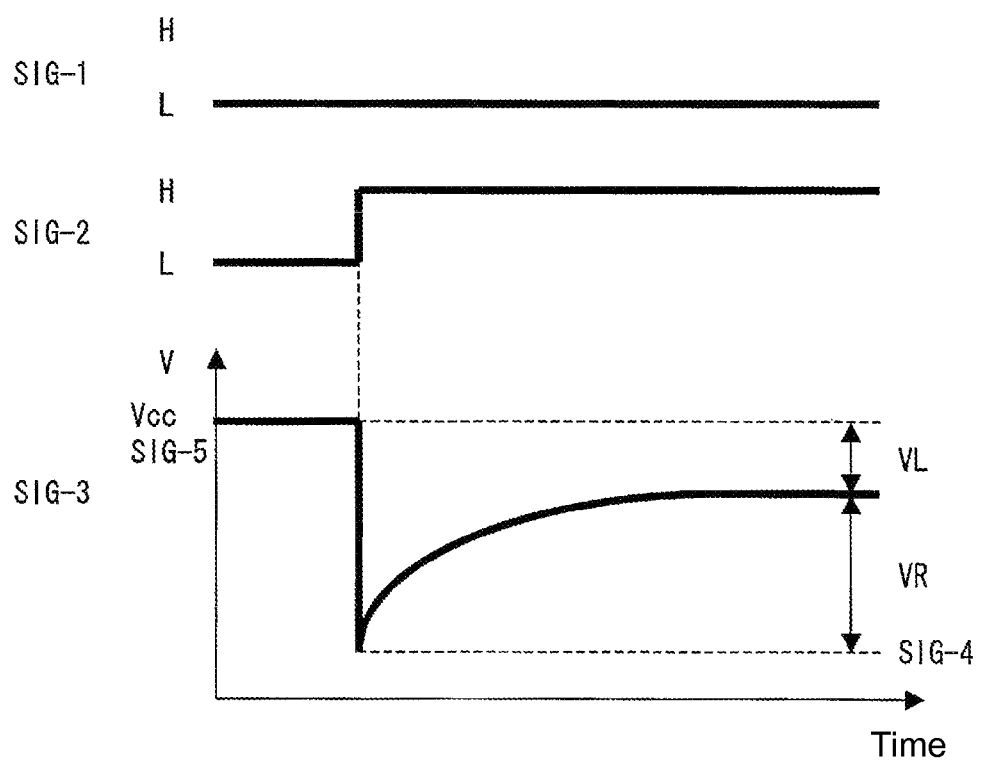
FIG. 3 is a waveform diagram illustrating operation of the deposition detection device.

FIG. 3 is a waveform diagram illustrating the operation of the deposition detection device 1. The drive signal input to the terminal SIG-1 is set to a low state in order to turn off the relay driver circuit 2. The transistor TR2 is operated by inputting the step input signal to the terminal SIG-2 coupled to the transistor TR2 of the deposition detection circuit 3. Therefore, as illustrated in FIG. 3, the transient response signal is output with a time constant of the excitation coil 6 from the terminal SIG-3 provided between the excitation coil 6 and the fixed resistor R1.

The transient response signal is stabilized at voltage that is decided by a ratio of voltage VL corresponding to a DC resistor RL of the excitation coil 6 and voltage VR corresponding to the fixed resistor R1. A condition that the movable contact 9 of the electromagnetic relay switch 5 is not turned on when the deposition detection circuit 3 is driven is that the voltage VL corresponding to the DC resistor RL is less than or equal to the operating voltage of the electromagnetic relay switch 5. Preferably VL/VR is less than or equal to 0.5 in consideration of the condition. VCE voltage of the transistor TR2 is output to the terminal SIG-4.

Figure 4:
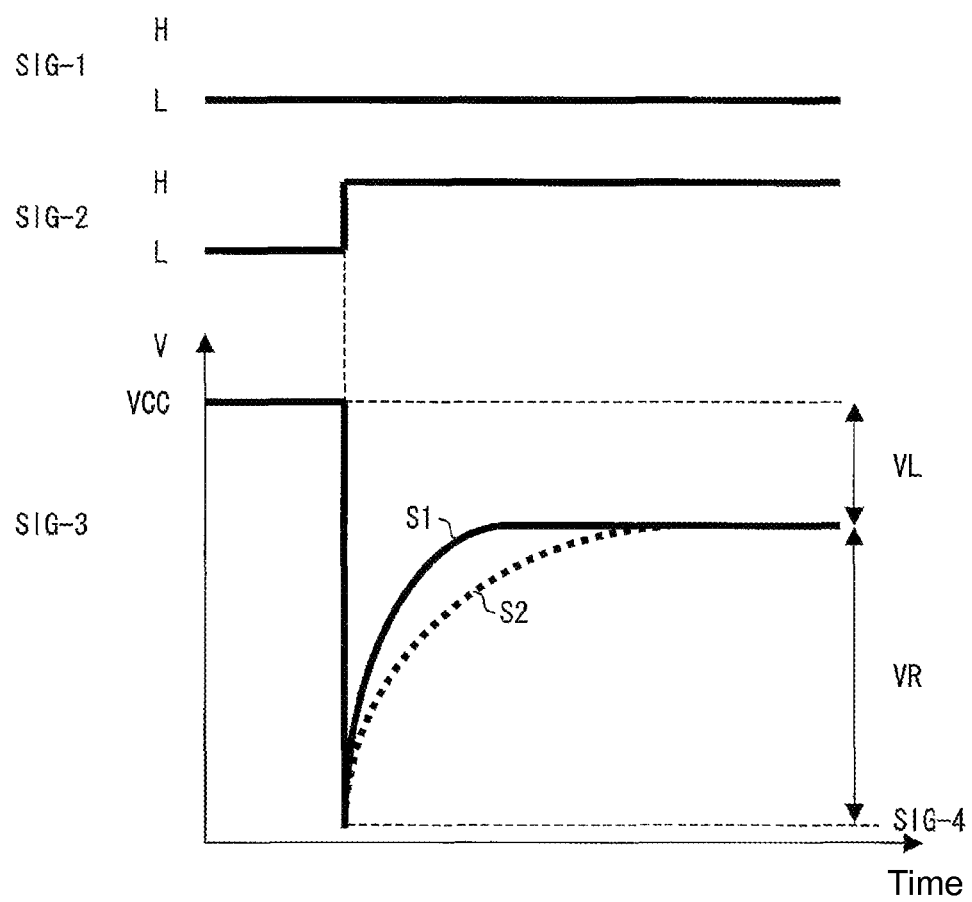
FIG. 4 is a view illustrating waveforms of the normally off state and deposition state of the electromagnetic relay switch.

FIG. 4 is a view illustrating waveforms of the normally off state and deposition state of the electromagnetic relay switch 5. An inductance of the excitation coil 6 changes depending on a position relative to the excitation coil 6 of the movable iron core 8. The time constant of the transient response signal changes when the inductance of the excitation coil 6 changes.

A transient response signal S1 is one in which the excitation coil 6 has the small inductance while the electromagnetic relay switch 5 is in the normally off state. A transient response signal S2 is one in which the excitation coil 6 has the large inductance while the electromagnetic relay switch 5 is in the deposition state. As illustrated in FIG. 4, the transient response signals S1 and S2 differ from each other in time constant. Accordingly, the inductance of the excitation coil 6 can be detected by measuring the transient response signal, and whether the deposition exists can be detected by measuring the transient response signal while the movable contact 9 of the electromagnetic relay switch 5 is kept in the off state.

Figures 5A, 5B:
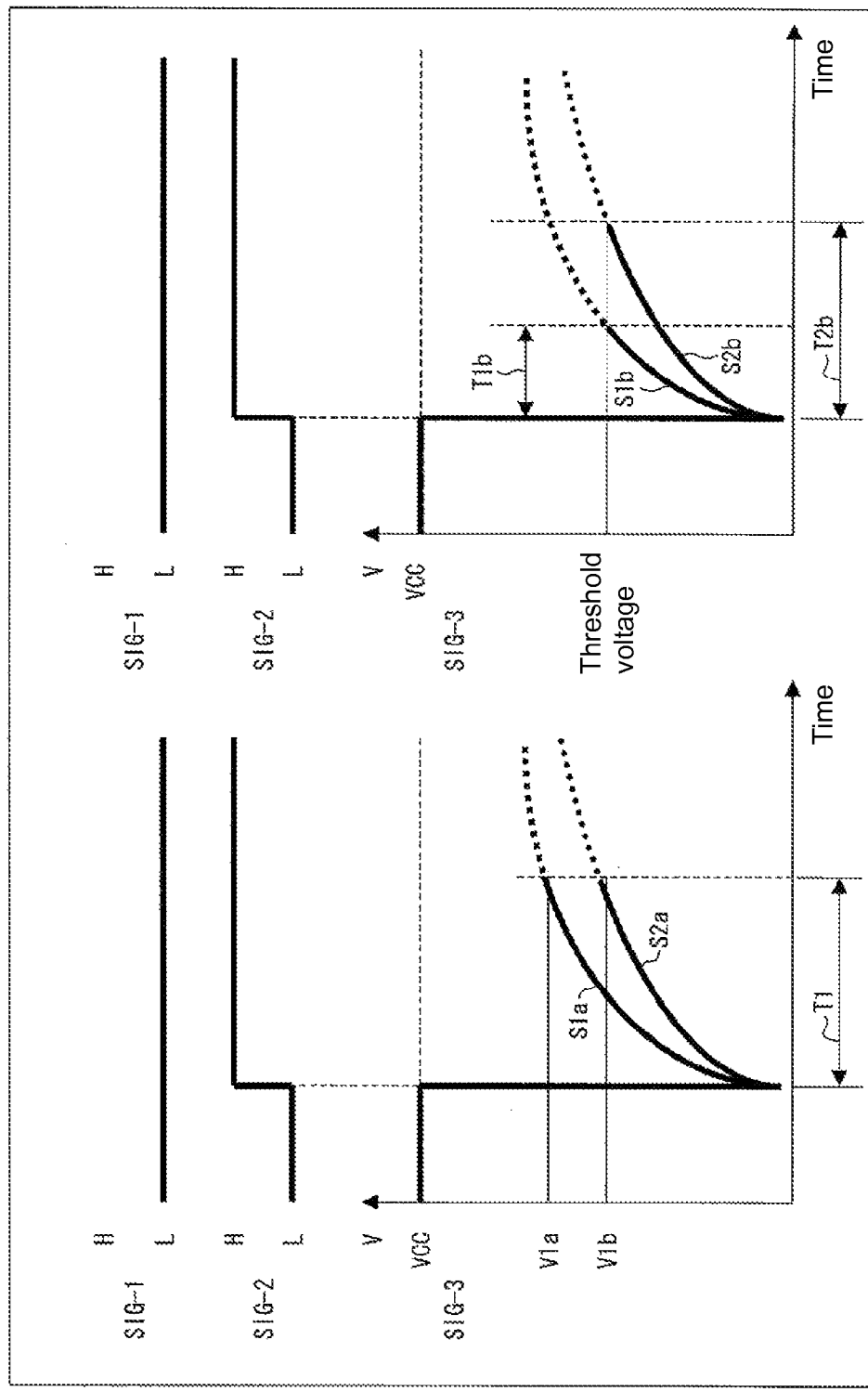
FIG. 5A is a waveform diagram illustrating a method for determining whether a movable contact of the deposition detection device is deposited.
FIG. 5B is a waveform diagram illustrating another method for determining whether the movable contact is deposited.

FIG. 5A is a waveform diagram illustrating a method for determining whether the movable contact 9 of the deposition detection device 1 is deposited, and FIG. 5B is a waveform diagram illustrating another method for determining whether the movable contact 9 is deposited.

In the example of FIG. 5A, whether the movable contact 9 is deposited is determined based on a voltage value of the transient response signal, which is output to the terminal SIG-3 after predetermined time T1 elapses since the step input signal is input to the terminal SIG-2.

In the case where the excitation coil 6 has the small inductance while the electromagnetic relay switch 5 is in the normally off state, it is assumed that the transient response signal S1$a$ has a voltage value V1$a$ when the predetermined time T1 elapses since the step input signal is input. In the case where the excitation coil 6 has the large inductance while the electromagnetic relay switch 5 is in the deposition state, it is assumed that the transient response signal S2a has a voltage value V1b when the predetermined time T1 elapses. A threshold voltage is set between the voltage value V1a and the voltage value V1b in order to detect the existence or non-existence of the deposition, and the voltage value of the transient response signal is compared to the threshold voltage after the time T1 elapses, thereby detecting the existence or non-existence of the deposition of the movable contact 9.

In the example of FIG. 5B, whether the movable contact 9 is deposited is determined based on the time until the voltage value of the transient response signal exceeds the threshold voltage since the step input signal is input to the terminal SIG-2.

It is assumed that elapsed time T1b is one when the transient response signal S1b for the excitation coil 6 having the small inductance reaches the threshold voltage while the electromagnetic relay switch 5 is in the normally off state. It is assumed that elapsed time T2b is one when the transient response signal S2b for the excitation coil 6 having the large inductance reaches the threshold voltage while the electromagnetic relay switch 5 is in the deposition state. Threshold time is set between the elapsed time T1b and the elapsed time T2b, and whether the movable contact 9 is deposited is determined based on the threshold time.

Figure 6A:
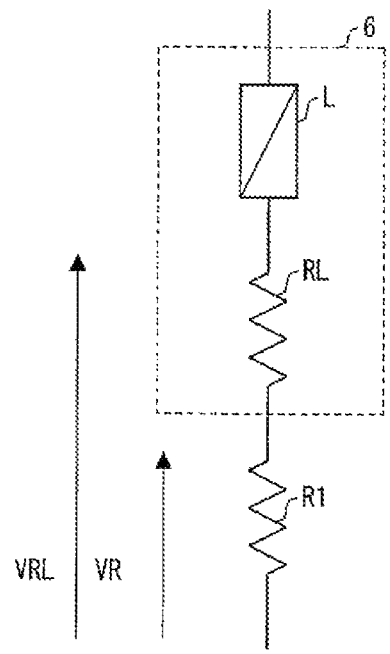
FIG. 6A is a view illustrating a relationship between an inductance and a DC resistor of a coil of the electromagnetic relay switch and a fixed resistor provided in the deposition detection device.
Figure 6B:
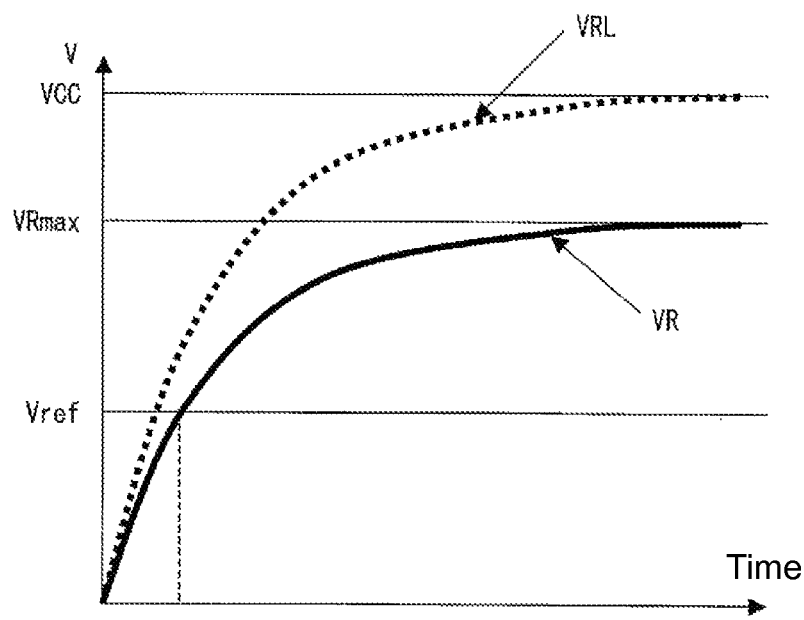
FIG. 6B is a view illustrating a relationship between values of the fixed resistor and DC resistor and a drive voltage of the electromagnetic relay switch.
Figures 7A, 7B:
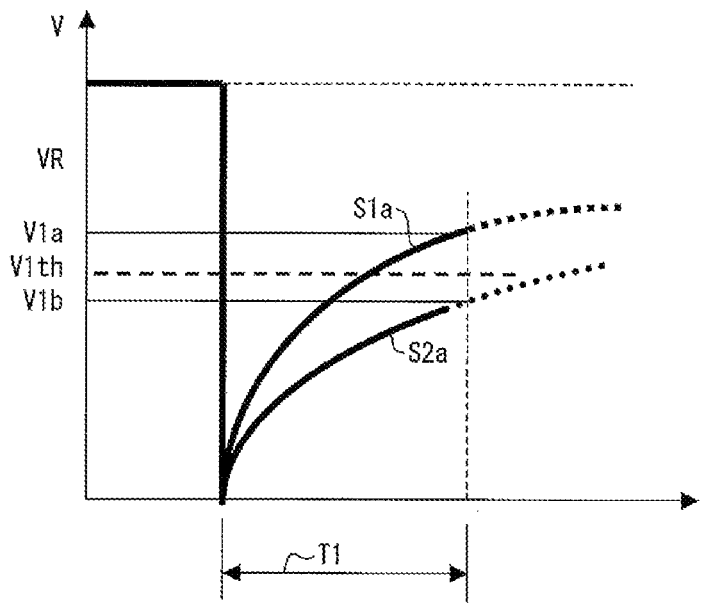
FIG. 7A is a waveform diagram illustrating a threshold setting method in the method for determining whether the movable contact is deposited.
FIG. 7B is a view illustrating a measured result based on the threshold.
Figures 8A, 8B:
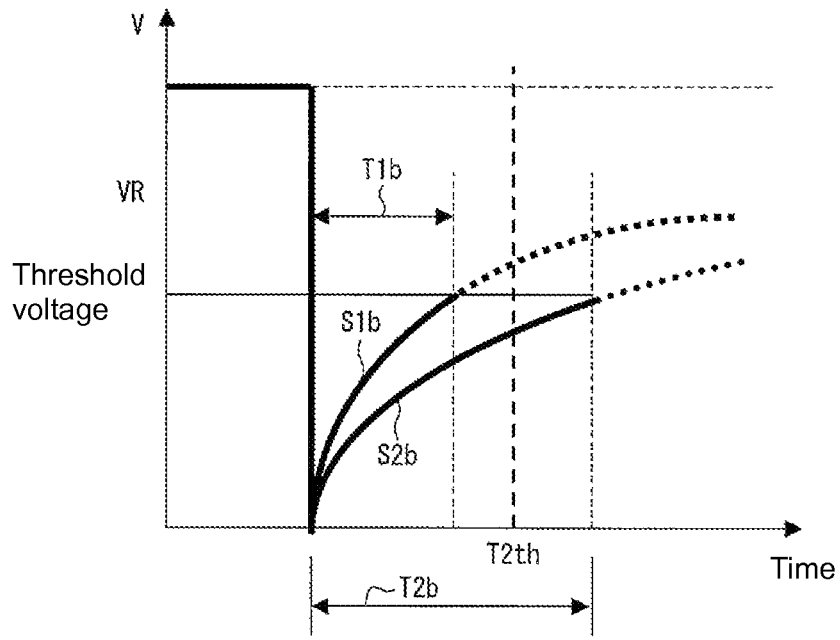
FIG. 8A is a waveform diagram illustrating a criterion value setting method in another method for determining whether the movable contact is deposited.
FIG. 8B is a view illustrating a measured result based on the criterion value.

FIG. 6A is a view illustrating a relationship between an inductance L and a DC resistor RL of the excitation coil 6 of the electromagnetic relay switch 5 and a fixed resistor R1 provided in the deposition detection circuit 3, and FIG. 6B is a waveform diagram illustrating a relationship between a voltage VRL at the fixed resistor R1 and DC resistor RL and a drive voltage VR of the electromagnetic relay switch 5. FIG. 7A is a waveform diagram illustrating a threshold setting method in the method for determining whether the movable contact 9 is deposited, and FIG. 7B is a view illustrating a measured result based on the threshold. FIG. 8A is a waveform diagram illustrating a criterion value setting method in another method for determining whether the movable contact 9 is deposited, and FIG. 8B is a view illustrating a measured result based on the criterion value.

A threshold voltage setting method will be described below. The value of the fixed resistor R1 is set in a range of two times to four times the value of the DC resistor RL of the excitation coil 6. When the value of the fixed resistor R1 is set to three times the value of the DC resistor RL (R1=3×RL), a voltage VRmax≅(3/4)×VCC is obtained. A target of the threshold voltage is (1/2)×VRmax (≅(3/8)×VCC). This is because a maximum difference is obtained around the threshold voltage of (1/2)×VRmax.

It is assumed that LOK is a previously-measured value in the normal state of the inductance, that LNG is a value in the deposition abnormal state, and that Lmid is an intermediate value ((LOK+LNG)/2).

The threshold voltage is obtained by Vref=(3/8)×VCC and a time change of the transient response signal voltage VR is obtained by VR=R1/(RL+R1)×VCC×(1−exp(−(RL+R1)×t/Lmid)). Therefore, Vref=VR is obtained at t=(ln(1−R1/(RL+R1)×(3/8)×Lmid))/(−(RL+R1)).

For example, assuming that
the DC resistor RL of the coil is 35Ω,
the value of the fixed resistor R1 is 105Ω,
the value LOK in the normal state of the previously-measured inductance is 400 mH, and
the value LNG in the deposition abnormal state of the previously-measured inductance is 900 mH,
t=3.34 msec is obtained.

With reference to FIGS. 7A and 7B, when the predetermined time T1 was set to 3.34 msec, the transient response signal voltage VR was measured after 3.34 msec since the step input signal was input to the terminal SIG-2,
under the conditions of
the DC resistor RL of the coil was 35Ω,
the fixed resistor R1 was 105Ω, and
the power supply voltage was 12 V. A criterion value V1th was 4.5 V (=3/8VCC).

The transient response signal voltage VR was 6.0 V when the electromagnetic relay switch 5 was in the normally off state, the transient response signal voltage VR was 3.5 V when the electromagnetic relay switch 5 was in the deposition state, and whether the movable contact 9 of the electromagnetic relay switch 5 was deposited was able to be detected using the criterion value V1th.

With reference to FIGS. 8A and 8B, the elapsed time until the transient response signal voltage VR reached the threshold voltage of 4.5V (=(3/8)VCC) since the step input signal is input to the terminal SIG-2. A criterion value T2th was 3.34 msec. The elapsed time T1b was 2.1 msec when the electromagnetic relay switch 5 was in the normally off state. The elapsed time T2b was 4.7 msec when the electromagnetic relay switch 5 was in the deposition state. Thus, whether the movable contact 9 of the electromagnetic relay switch 5 was deposited was able to be detected using the criterion value T2th of 3.34 msec.

Second Embodiment

Deposition Detection Device 1a

Figure 9:
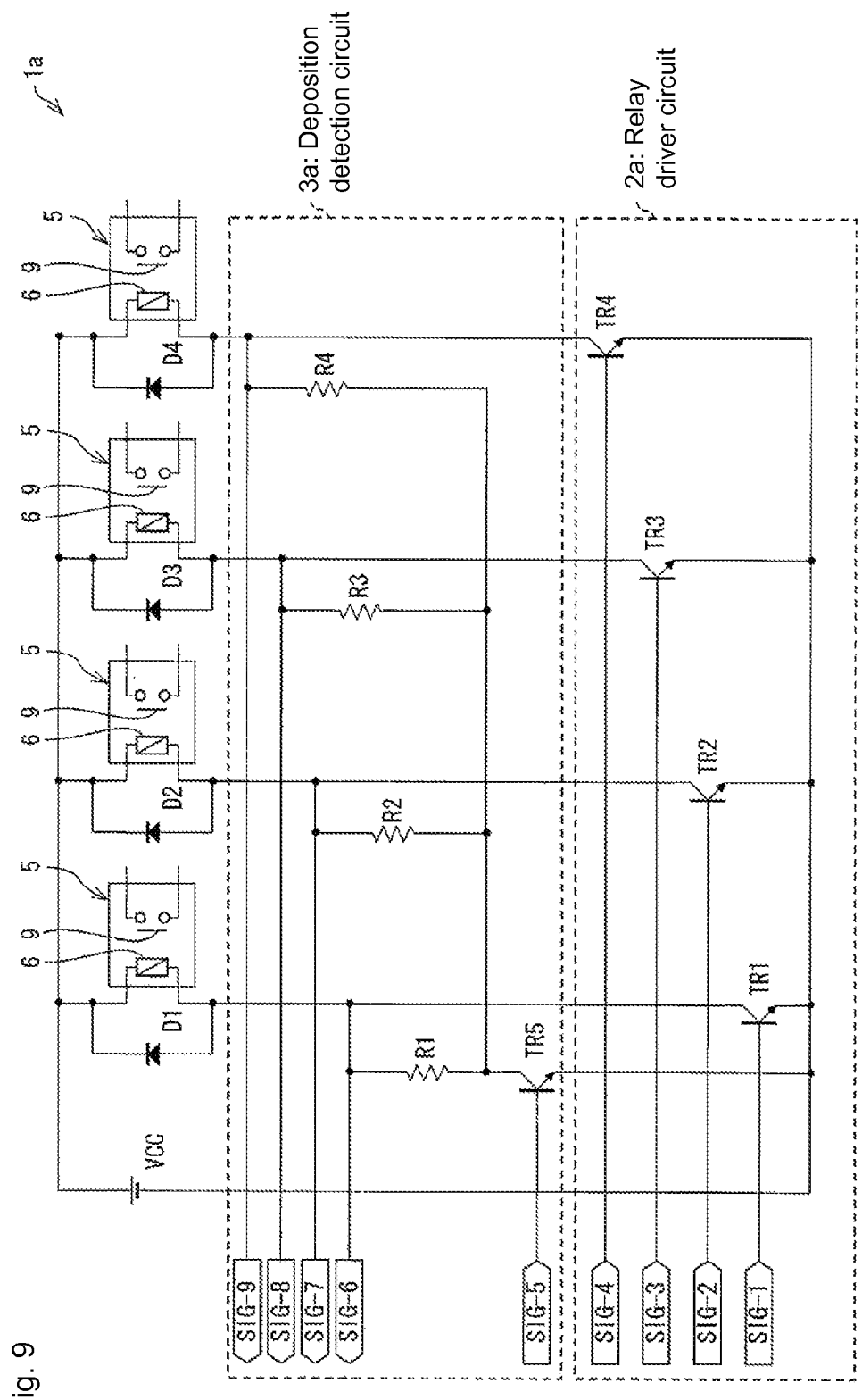
FIG. 9 is a circuit diagram illustrating a configuration of a deposition detection device according to a second embodiment.
Figure 10:
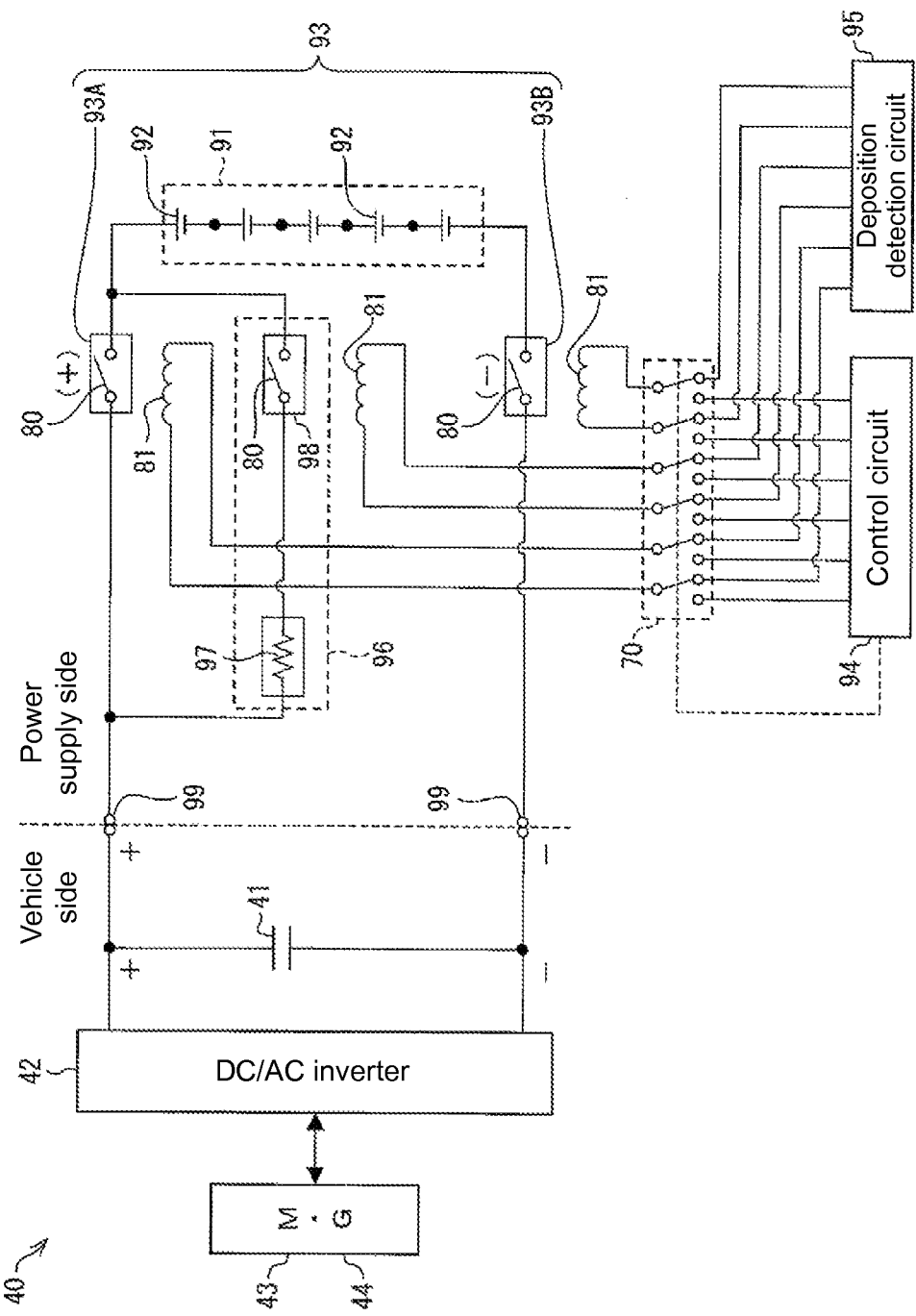
FIG. 10 is a circuit diagram illustrating a conventional deposition detection device.
Figure 11A:
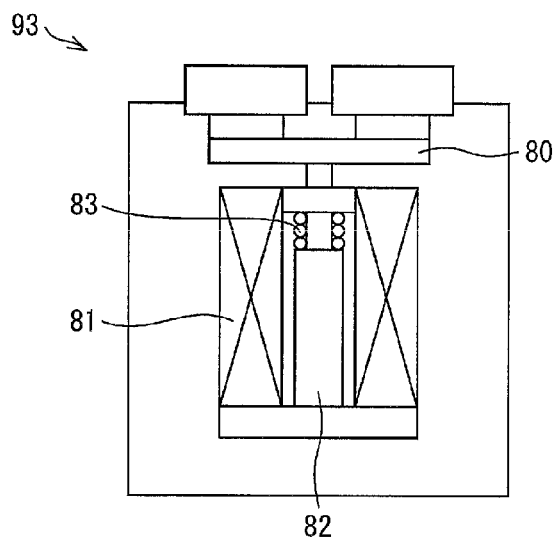
FIG. 11A is a sectional view illustrating an on state (deposition state) of the electromagnetic relay switch in which the existence or non-existence of the deposition is detected by the deposition detection device.
Figure 11B:
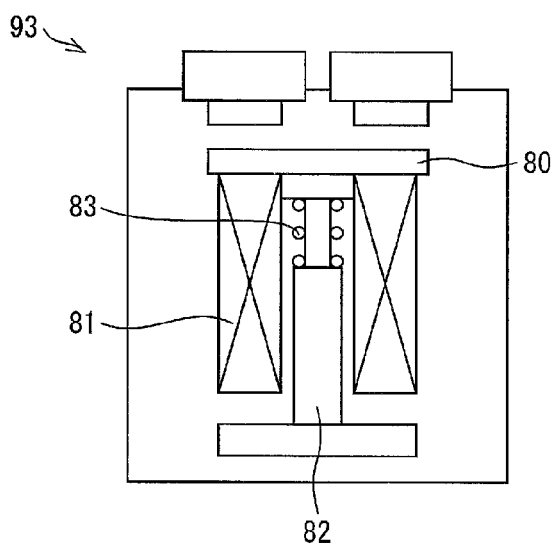
FIG. 11B is a sectional view illustrating an off state of the electromagnetic relay switch.
Figure 12:
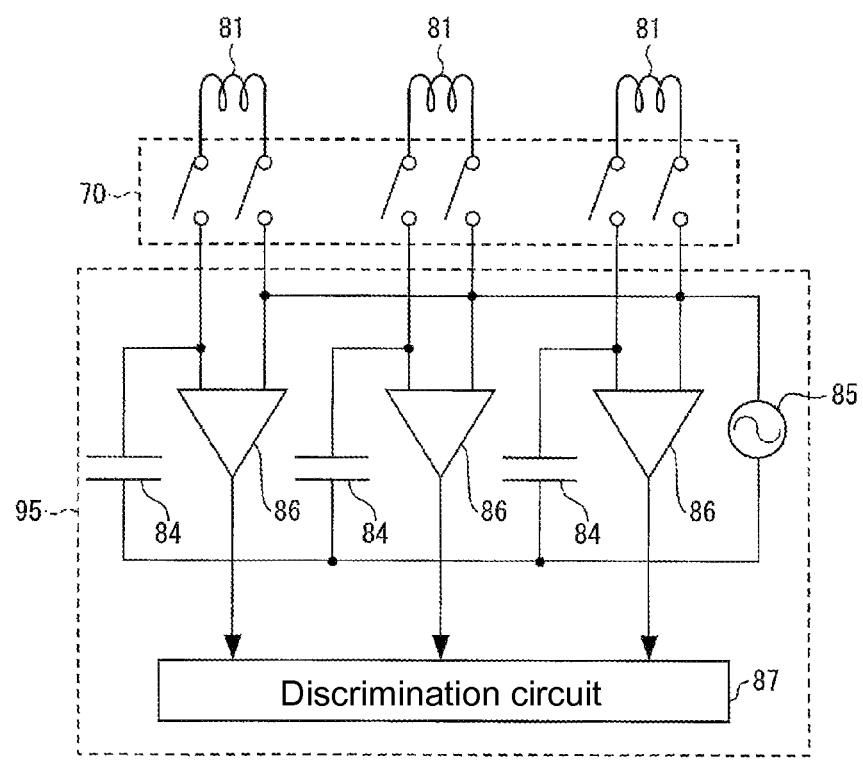
FIG. 12 is a circuit diagram illustrating an internal configuration of a deposition detection circuit provided in the deposition detection device.
Figure 13:
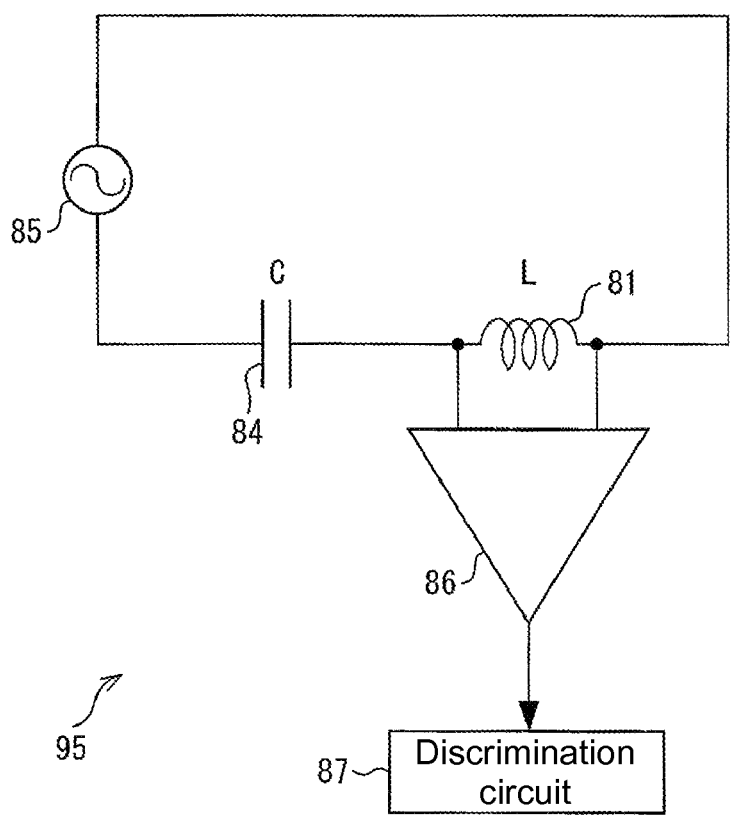
FIG. 13 is a view illustrating an operating principal of the deposition detection circuit.

FIG. 9 is a circuit diagram illustrating a configuration of a deposition detection device 1a according to a second embodiment. The component identical to that of the first embodiment is designated by the identical symbol. Accordingly, the overlapping description of the identical component is neglected.

The deposition detection device 1a includes a relay driver circuit 2a that drives each of four electromagnetic relay switches 5 arranged in parallel to one another and a deposition detection circuit 3a that detects the deposition of each of the electromagnetic relay switches 5. Each of a diode D1, a diode D2, a diode D3, and a diode D4 are coupled to both ends of each of the excitation coils 6 of the four electromagnetic relay switches 5.

The relay driver circuit 2a includes a transistor TR1 that drives one of the four electromagnetic relay switches 5, a transistor TR2 that drives another electromagnetic relay switch 5, a transistor TR3 that drives still another electromagnetic relay switch 5, and a transistor TR4 that drives yet another electromagnetic relay switch 5. The terminal SIG-1 is connected to the transistor TR1, and the terminal SIG-2 is connected to the transistor TR2. The terminal SIG-3 is connected to the transistor TR3, and the terminal SIG-4 is connected to the transistor TR4.

The deposition detection circuit 3a includes a fixed resistor R1 that is connected to one of the four electromagnetic relay switches 5, a fixed resistor R2 that is connected to another electromagnetic relay switch 5, a fixed resistor R3 that is connected to still another electromagnetic relay switch 5, a fixed resistor R4 that is connected to yet another electromagnetic relay switch 5, and a transistor TR5 that is connected to one end of each of the fixed resistors R1, R2, R3, and R4 on the opposite side to the electromagnetic relay switch 5. The terminal SIG-5 is coupled to the transistor TR5. A terminal SIG-6 is connected to one end of the fixed resistor R1 on the side of the electromagnetic relay switch 5, and a terminal SIG-7 is connected to one end of the fixed resistor R2 on the side of the electromagnetic relay switch 5. A terminal SIG-8 is connected to one end of the fixed resistor R3 on the side of the electromagnetic relay switch 5, and a terminal SIG-9 is connected to one end of the fixed resistor R4 on the side of the electromagnetic relay switch 5.

In the deposition detection circuit 3a, it is not necessary to provide four transistors corresponding to the fixed resistors R1 to R4, but it is necessary to commonly provide only one transistor TR5 in the fixed resistors R1 to R4. Accordingly, in the configuration in which the depositions of the plural electromagnetic relay switches 5 are detected, the number of transistors provided in the deposition detection circuit can be decreased.

The transistor TR5 is not limited to a transistor, but any switch, such as an FET, a photo coupler, and a relay, which performs on and off operations in response to the input to the terminal SIG-5 from the outside.

The present invention is not limited to the above embodiments, but various changes can be made without departing from the scope of the claims. It is noted that the embodiment obtained by a proper combination of technical means disclosed in the embodiments is included in the technical scope of the present invention.

According to one aspect of the present invention, a deposition detection device for an electromagnetic relay switch in which a movable iron core is arranged at one end of a drive shaft provided in a reciprocable manner in a center axis direction of an excitation coil while a movable contact is arranged at the other end of the drive shaft, the movable iron core and the movable contact being integrally reciprocable, the deposition detection device for the electromagnetic relay switch includes: a driver circuit configured to apply voltage to the excitation coil based on on and off states of a drive signal; and a deposition detection circuit that is connected to the excitation coil in parallel to the driver circuit in order to detect deposition of the movable contact. At this point, a fixed resistor connected to the excitation coil is provided in the deposition detection circuit, and the deposition detection circuit includes a determination circuit configured to determine whether the movable contact is deposited based on a step input signal and a transient response signal when the drive signal is in the off state, the transient response signal being generated so as to correspond to voltage less than or equal to operating voltage of the electromagnetic relay switch according to the excitation coil and the fixed resistor.

Therefore, when the drive signal is off, whether the movable contact is deposited is determined based on the step input signal and the transient response signal. The transient response signal is generated so as to correspond to the voltage less than or equal to the operating voltage of the electromagnetic relay switch according to the excitation coil and the fixed resistor. Therefore, in the case where the inductance of the excitation coil is detected to determine whether the movable contact is deposited, such a large-scale configuration as an oscillation circuit is eliminated unlike the conventional configuration, and whether the movable contact is deposited can be determined by detecting the inductance of the excitation coil using a simple configuration provided only with the fixed resistor.

In the deposition detection device for the electromagnetic relay switch according to the present invention, preferably the determination circuit determines whether the movable contact is deposited based on a voltage value of the transient response signal after predetermined time elapses since the step input signal is input.

Accordingly, the inductance of the excitation coil can be measured by the simple configuration.

In the deposition detection device for the electromagnetic relay switch according to the present invention, preferably the determination circuit determines whether the movable contact is deposited based on time until a voltage value of the transient response signal exceeds a threshold voltage since the step input signal is input.

Accordingly, the inductance of the excitation coil can be measured by the simple configuration.

According to another aspect of the present invention, a deposition detection device for first and second electromagnetic relay switches, a first movable iron core being arranged at one end of a first drive shaft provided in a reciprocable manner in a center axis direction of a first excitation coil while a first movable contact is arranged at the other end of the first drive shaft in the first electromagnetic relay switch, the first movable iron core and the first movable contact being integrally reciprocable, a second movable iron core being arranged at one end of a second drive shaft provided in a reciprocable manner in a center axis direction of a second excitation coil while a second movable contact is arranged at the other end of the second drive shaft in the second electromagnetic relay switch, the second movable iron core and the second movable contact being integrally reciprocable, the deposition detection device for the first and second electromagnetic relay switches includes: a driver circuit configured to apply voltage to the first excitation coil based on on and off states of a first drive signal and apply voltage to the second excitation coil based on on and off states of a second drive signal; and a deposition detection circuit that is connected to the first and second excitation coils in order to detect depositions of the first and second movable contacts. At this point, a first fixed resistor connected to the first excitation coil and a second fixed resistor connected to the second excitation coil are provided in the deposition detection circuit, and the deposition detection circuit includes: a first determination circuit configured to determine whether the first movable contact is deposited based on a step input signal and a first transient response signal when the first drive signal is in the off state, the first transient response signal being generated so as to correspond to voltage less than or equal to operating voltage of the first electromagnetic relay switch according to the first excitation coil and the first fixed resistor; and a second determination circuit configured to determine whether the second movable contact is deposited based on the step input signal and a second transient response signal when the second drive signal is in the off state, the second transient response signal being generated so as to correspond to voltage less than or equal to operating voltage of the second electromagnetic relay switch according to the second excitation coil and the second fixed resistor.

According to still another aspect of the present invention, a deposition detection method for an electromagnetic relay switch in which a movable iron core is arranged at one end of a drive shaft provided in a reciprocable manner in a center axis direction of an excitation coil while a movable contact is arranged at the other end of the drive shaft, the movable iron core and the movable contact being integrally reciprocable, the deposition detection method for the electromagnetic relay switch includes: applying voltage to the excitation coil based on on and off states of a drive signal using a driver circuit; and detecting deposition of the movable contact using a deposition detection circuit connected to the excitation coil in parallel to the driver circuit. At this point, a fixed resistor connected to the excitation coil is provided in the deposition detection circuit, and whether the movable contact is deposited is determined based on a step input signal and a transient response signal when the drive signal is in the off state, the transient response signal being generated so as to correspond to voltage less than or equal to operating voltage of the electromagnetic relay switch according to the excitation coil and the fixed resistor.

In the deposition detection method for the electromagnetic relay switch according to the present invention, preferably whether the movable contact is deposited is determined based on a voltage value of the transient response signal after predetermined time elapses since the step input signal is input.

In the deposition detection method for the electromagnetic relay switch according to the present invention, preferably whether the movable contact is deposited is determined based on time until a voltage value of the transient response signal exceeds a threshold voltage since the step input signal is input.

According to yet another aspect of the present invention, a deposition detection method for first and second electromagnetic relay switches, a first movable iron core being arranged at one end of a first drive shaft provided in a reciprocable manner in a center axis direction of a first excitation coil while a first movable contact is arranged at the other end of the first drive shaft in the first electromagnetic relay switch, the first movable iron core and the first movable contact being integrally reciprocable, a second movable iron core being arranged at one end of a second drive shaft provided in a reciprocable manner in a center axis direction of a second excitation coil while a second movable contact is arranged at the other end of the second drive shaft in the second electromagnetic relay switch, the second movable iron core and the second movable contact being integrally reciprocable, the deposition detection method for the first and second electromagnetic relay switches includes: applying voltage to the first excitation coil based on on and off states of a first drive signal and applying voltage to the second excitation coil based on on and off states of a second drive signal; and detecting depositions of the first and second movable contacts using a deposition detection circuit that is connected to the first and second excitation coils. At this point, a first fixed resistor connected to the first excitation coil and a second fixed resistor connected to the second excitation coil are provided in the deposition detection circuit, whether the first movable contact is deposited is determined based on a step input signal and a first transient response signal when the first drive signal is in the off state, the first transient response signal being generated so as to correspond to voltage less than or equal to operating voltage of the first electromagnetic relay switch according to the first excitation coil and the first fixed resistor, and whether the second movable contact is deposited is determined based on a step input signal and a second transient response signal when the second drive signal is in the off state, the second transient response signal being generated so as to correspond to voltage less than or equal to operating voltage of the second electromagnetic relay switch according to the second excitation coil and the second fixed resistor.

INDUSTRIAL APPLICABILITY

The present invention can be applied to a deposition detection device that detects whether a movable contact is deposited in an electromagnetic relay switch, in which a movable iron core is arranged at one end of a drive shaft provided in a reciprocable manner in a center axis direction of an excitation coil while the movable contact is arranged at the other end of the drive shaft and the movable iron core and the movable contact are integrally reciprocable.

DESCRIPTION OF SYMBOLS 1 deposition detection device
2 relay driver circuit (driver circuit)
3 deposition detection circuit
4 determination circuit
5 electromagnetic relay switch
6 excitation coil
7 drive shaft
8 movable iron core
9 movable contact
10 fixed contact

The invention claimed is:

1. A deposition detection device for an electromagnetic relay switch in which a movable iron core is arranged at one end of a drive shaft provided in a reciprocable manner in a center axis direction of an excitation coil while a movable contact is arranged at the other end of the drive shaft, the movable iron core and the movable contact being integrally reciprocable, the deposition detection device for the electromagnetic relay switch comprising:
a driver circuit configured to apply voltage to the excitation coil based on on and off states of a drive signal; and
a deposition detection circuit that is connected to the excitation coil in parallel to the driver circuit in order to detect deposition of the movable contact,
wherein a fixed resistor connected to the excitation coil is provided in the deposition detection circuit, and
the deposition detection circuit comprises a determination circuit configured to determine whether the movable contact is deposited based on a step input signal and a transient response signal when the drive signal is in the off state, the transient response signal being generated so as to correspond to voltage less than or equal to operating voltage of the electromagnetic relay switch according to the excitation coil and the fixed resistor.

2. The deposition detection device for the electromagnetic relay switch according to claim 1, wherein the determination circuit determines whether the movable contact is deposited based on a voltage value of the transient response signal after predetermined time elapses since the step input signal is input.

3. The deposition detection device for the electromagnetic relay switch according to claim 1, wherein the determination circuit determines whether the movable contact is deposited based on time until a voltage value of the transient response signal exceeds a threshold voltage since the step input signal is input.

4. A deposition detection device for first and second electromagnetic relay switches, a first movable iron core being arranged at one end of a first drive shaft provided in a reciprocable manner in a center axis direction of a first excitation coil while a first movable contact is arranged at the other end of the first drive shaft in the first electromagnetic relay switch, the first movable iron core and the first movable contact being integrally reciprocable, a second movable iron core being arranged at one end of a second drive shaft provided in a reciprocable manner in a center axis direction of a second excitation coil while a second movable contact is arranged at the other end of the second drive shaft in the second electromagnetic relay switch, the second movable iron core and the second movable contact being integrally reciprocable, the deposition detection device for the first and second electromagnetic relay switches comprising:
a driver circuit configured to apply voltage to the first excitation coil based on on and off states of a first drive signal and apply voltage to the second excitation coil based on on and off states of a second drive signal; and
a deposition detection circuit that is connected to the first and second excitation coils in order to detect depositions of the first and second movable contacts, wherein a first fixed resistor connected to the first excitation coil and a second fixed resistor connected to the second excitation coil are provided in the deposition detection circuit, and the deposition detection circuit comprises: a first determination circuit configured to determine whether the first movable contact is deposited based on a step input signal and a first transient response signal when the first drive signal is in the off state, the first transient response signal being generated so as to correspond to voltage less than or equal to operating voltage of the first electromagnetic relay switch according to the first excitation coil and the first fixed resistor; and a second determination circuit configured to determine whether the second movable contact is deposited based on a step input signal and a second transient response signal when the second drive signal is in the off state, the second transient response signal being generated so as to correspond to voltage less than or equal to operating voltage of the second electromagnetic relay switch according to the second excitation coil and the second fixed resistor.

5. A deposition detection method for an electromagnetic relay switch in which a movable iron core is arranged at one end of a drive shaft provided in a reciprocable manner in a center axis direction of an excitation coil while a movable contact is arranged at the other end of the drive shaft, the movable iron core and the movable contact being integrally reciprocable, the deposition detection method for the electromagnetic relay switch comprising:

applying voltage to the excitation coil based on on and off states of a drive signal using a driver circuit; and detecting deposition of the movable contact using a deposition detection circuit connected to the excitation coil in parallel to the driver circuit, wherein a fixed resistor connected to the excitation coil is provided in the deposition detection circuit, and whether the movable contact is deposited is determined based on a step input signal and a transient response signal when the drive signal is in the off state, the transient response signal being generated so as to correspond to voltage less than or equal to operating voltage of the electromagnetic relay switch according to the excitation coil and the fixed resistor.

6. The deposition detection method for the electromagnetic relay switch according to claim 5, wherein whether the movable contact is deposited is determined based on a voltage value of the transient response signal after predetermined time elapses since the step input signal is input.

7. The deposition detection method for the electromagnetic relay switch according to claim 5, wherein whether the movable contact is deposited is determined based on time until a voltage value of the transient response signal exceeds a threshold voltage since the step input signal is input.

8. A deposition detection method for first and second electromagnetic relay switches, a first movable iron core being arranged at one end of a first drive shaft provided in a reciprocable manner in a center axis direction of a first excitation coil while a first movable contact is arranged at the other end of the first drive shaft in the first electromagnetic relay switch, the first movable iron core and the first movable contact being integrally reciprocable, a second movable iron core being arranged at one end of a second drive shaft provided in a reciprocable manner in a center axis direction of a second excitation coil while a second movable contact is arranged at the other end of the second drive shaft in the second electromagnetic relay switch, the second movable iron core and the second movable contact being integrally reciprocable, the deposition detection method for the first and second electromagnetic relay switches comprising:

applying voltage to the first excitation coil based on on and off states of a first drive signal and applying voltage to the second excitation coil based on on and off states of a second drive signal; and detecting depositions of the first and second movable contacts using a deposition detection circuit that is connected to the first and second excitation coils, wherein a first fixed resistor connected to the first excitation coil and a second fixed resistor connected to the second excitation coil are provided in the deposition detection circuit, and whether the first movable contact is deposited is determined based on a step input signal and a first transient response signal when the first drive signal is in the off state, the first transient response signal being generated so as to correspond to voltage less than or equal to operating voltage of the first electromagnetic relay switch according to the first excitation coil and the first fixed resistor, and whether the second movable contact is deposited is determined based on a step input signal and a second transient response signal when the second drive signal is in the off state, the second transient response signal being generated so as to correspond to voltage less than or equal to operating voltage of the second electromagnetic relay switch according to the second excitation coil and the second fixed resistor.

\* \* \* \* \*